(12) United States Patent
Wang et al.

(10) Patent No.: US 12,471,278 B2
(45) Date of Patent: Nov. 11, 2025

(54) THREE-DIMENSIONAL MEMORY DEVICE WITH CHARGE TRAP LAYER INCLUDING CARBON REGION AND FABRICATION METHOD THEREOF

(71) Applicant: Yangtze Memory Technologies Co., Ltd., Wuhan (CN)

(72) Inventors: Qiguang Wang, Wuhan (CN); Hao Pu, Wuhan (CN); Tuo Li, Wuhan (CN); Yingjie Zhao, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 550 days.

(21) Appl. No.: 17/457,787

(22) Filed: Dec. 6, 2021

(65) Prior Publication Data
US 2023/0134694 A1 May 4, 2023

Related U.S. Application Data

(63) Continuation of application No. PCT/CN2021/128337, filed on Nov. 3, 2021.

(51) Int. Cl.
*H10B 43/27* (2023.01)
*H10B 43/10* (2023.01)
*H10B 43/35* (2023.01)

(52) U.S. Cl.
CPC ............ *H10B 43/27* (2023.02); *H10B 43/10* (2023.02); *H10B 43/35* (2023.02)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS

| | | | |
|---|---|---|---|
| 11,088,252 B2 | 8/2021 | Kasai | |
| 2009/0121271 A1* | 5/2009 | Son | H01L 21/8221 257/315 |
| 2012/0120728 A1* | 5/2012 | Kim | H01L 29/7926 257/315 |
| 2013/0087846 A1* | 4/2013 | Lee | H01L 21/32133 257/E21.09 |
| 2020/0203362 A1 | 6/2020 | Rabkin et al. | |
| 2020/0287007 A1* | 9/2020 | Kasai | H01L 29/4234 |
| 2021/0090992 A1 | 3/2021 | Li et al. | |
| 2021/0193845 A1* | 6/2021 | Siddik | H10D 30/694 |
| 2021/0257378 A1 | 8/2021 | Yu et al. | |

* cited by examiner

*Primary Examiner* — William B Partridge
*Assistant Examiner* — Gustavo G Ramallo
(74) *Attorney, Agent, or Firm* — Anova Law Group, PLLC

(57) ABSTRACT

Three-dimensional (3D) NAND memory devices and methods are provided. In one aspect, a fabrication method includes forming a layer stack, a channel hole, a blocking layer, a charge trap layer, a tunnel insulation layer, and a channel layer. The surface region of the charge trap layer includes a carbon region that contains a certain amount of carbon elements.

9 Claims, 10 Drawing Sheets

THREE-DIMENSIONAL MEMORY DEVICE WITH CHARGE TRAP LAYER INCLUDING CARBON REGION AND FABRICATION METHOD THEREOF

CROSS-REFERENCE TO RELATED APPLICATION

This application claims the priority to PCT Patent Application No. PCT/CN2021/128337 filed on Nov. 3, 2021, the entire content of which is incorporated herein by reference.

FIELD OF THE TECHNOLOGY

This application relates to the field of semiconductor technology and, specifically, to a three-dimensional (3D) memory device and fabrication method thereof.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

Memory cells of a 3D NAND device include a tunnel insulation layer deposited on a charge trap layer. During the deposition process, some defects typically form in the interface between the tunnel insulation layer and charge trap layer, and subsequent annealing processes can cause more defects in the interface. These defects affect the reliability of the 3D NAND device, such as the endurance and charge retention characteristics.

SUMMARY

In one aspect of the present disclosure, a method for fabricating a 3D memory device includes providing a substrate for the 3D memory device, forming a layer stack over a top surface of the substrate, forming a channel hole that extends through the layer stack, forming a blocking layer on a sidewall of the channel hole, forming a charge trap layer on a surface of the blocking layer, forming a tunnel insulation layer over a surface region of the charge trap layer, forming a channel layer on a surface of the tunnel insulation layer, and forming memory cells through the layer stack. The surface region of the charge trap layer includes a carbon region that contains a certain amount of carbon elements. Each memory cell includes a portion of the blocking layer, the charge trap layer, and the tunnel insulation layer.

In another aspect of the present disclosure, a 3D memory device includes a substrate, a layer stack formed over the substrate, a channel layer extending through the layer stack, a functional layer extending through the layer stack and formed between the channel layer and the layer stack, and memory cells formed through the layer stack. The functional layer includes a blocking layer, a charge trap layer, and a tunnel insulation layer. The charge trap layer includes a carbon region that contains a certain amount of carbon elements. Each memory cell includes a portion of the functional layer.

In another aspect of the present disclosure, a memory apparatus includes an input/output (I/O) component for receiving an input, a buffer for buffering a signal, a controller for implementing an operation, and a 3D memory device. The 3D memory device includes a substrate, a layer stack formed over the substrate, a channel layer extending through the layer stack, a functional layer extending through the layer stack and formed between the channel layer and the layer stack, and memory cells formed through the layer stack. The functional layer includes a blocking layer, a charge trap layer, and a tunnel insulation layer. The charge trap layer includes a carbon region that contains a certain amount of carbon elements. Each memory cell includes a portion of the functional layer.

Other aspects of the present disclosure can be understood by those skilled in the art in light of the description, the claims, and the drawings of the present disclosure.

DETAILED DESCRIPTION

The following describes the technical solutions according to various aspects of the present disclosure with reference to the accompanying drawings. Wherever possible, the same reference numbers will be used throughout the drawings to refer to the same or like parts. Apparently, the described aspects are merely some but not all of the aspects of the present disclosure. Features in various aspects may be exchanged and/or combined.

FIGS. 1-12 schematically show a fabrication process of an exemplary 3D array device 100 according to aspects of the present disclosure. The 3D array device 100 is a part of a memory device and may also be referred to as a 3D memory structure. Among the figures, top views are in an X-Y plane and cross-sectional views are in a Y-Z plane or along a line in the X-Y plane.

Figure 1:
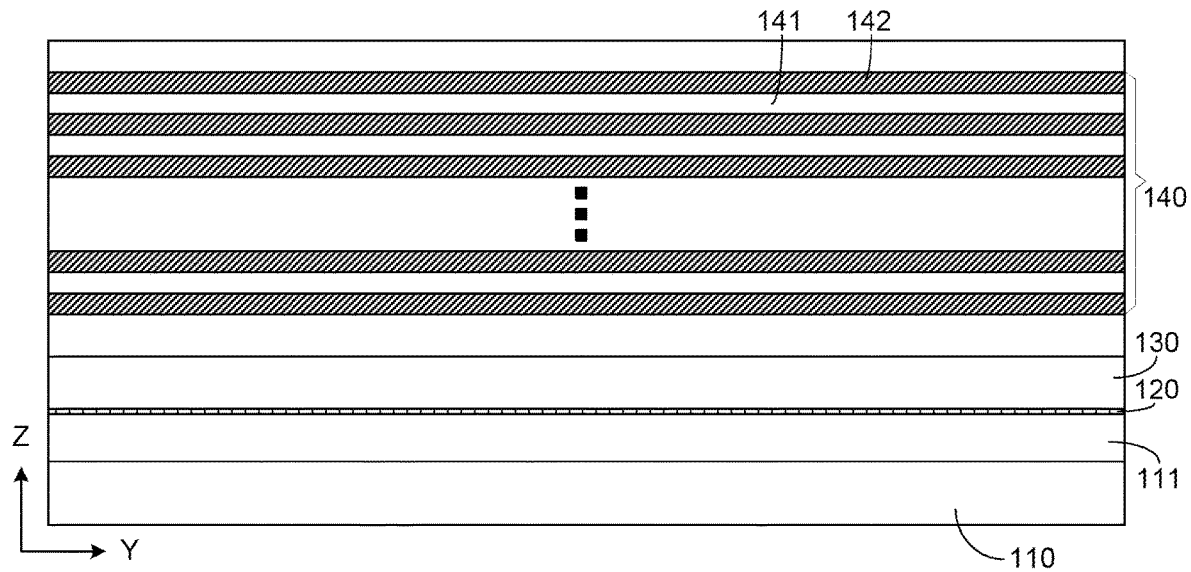
FIGS. 1 and 2 illustrate cross-sectional views of an exemplary three-dimensional (3D) array device at certain stages during a fabrication process according to various aspects of the present disclosure.

As shown in a cross-sectional view in FIG. 1, the 3D array device 100 includes a substrate 110. In some aspects, the substrate 110 may include a single crystalline silicon layer. The substrate 110 may also include a semiconductor material, such as germanium (Ge), silicon-germanium (SiGe), silicon carbide (SiC), silicon-on-insulator (SOI), germanium-on-insulator (GOI), polysilicon, or a Group III-V compound such as gallium arsenide (GaAs) or indium phosphide (InP). Optionally, the substrate 110 may also include an electrically non-conductive material such as glass, a plastic material, or a ceramic material. When the substrate 110 includes glass, plastic, or ceramic material, the substrate 110 may further include a thin layer of polysilicon deposited on the glass, plastic, or ceramic material. In this case, the substrate 110 may be processed like a polysilicon substrate. As an example, the substrate 110 includes an undoped or lightly doped single crystalline silicon layer in descriptions below.

In some aspects, a top portion of the substrate 110 is doped by n-type dopants via ion implantation and/or diffusion to form a doped region 111. The dopants of the doped region 111 may include, for example, phosphorus (P), arsenic (As), and/or antimony (Sb). As shown in FIG. 1, a cover layer 120 is deposited over the doped region 111. The cover layer 120 is a sacrificial layer and may include a single layer or a multilayer. For example, the cover layer 120 may include one or more of silicon oxide layer and silicon nitride layer. The cover layer 120 may be deposited by chemical vapor deposition (CVD), physical vapor deposition (PVD), atomic layer deposition (ALD), or a combination thereof. In some other aspects, the cover layer 120 may include another material such as aluminum oxide.

Further, over the cover layer 120, a sacrificial layer 130 is deposited. The sacrificial layer 130 may include a dielectric material, a semiconductor material, or a conductive material. The word "conductive", as used herein, indicates electrically conductive. An exemplary material for the sacrificial layer 130 is polysilicon.

After the polysilicon sacrificial layer 130 is formed, a layer stack 140 is formed. The layer stack 140 includes multiple pairs of stack layers, for example, including first dielectric layers 141 and second dielectric layers 142, stacked alternately over each other. The layer stack may include 64 pairs, 128 pairs, or more than 128 pairs of the first and second dielectric layers 141 and 142.

In some aspects, the first dielectric layers 141 and the second dielectric layers 142 are made of different materials. In descriptions below, the first dielectric layer 141 includes a silicon oxide layer exemplarily, which may be used as an isolation stack layer, while the second dielectric layer 142 includes a silicon nitride layer exemplarily, which may be used as a sacrificial stack layer. The sacrificial stack layer will be subsequently etched out and replaced by a conductor layer. The first dielectric layers 141 and the second dielectric layers 142 may be deposited via CVD, PVD, ALD, or a combination thereof.

Figure 2:
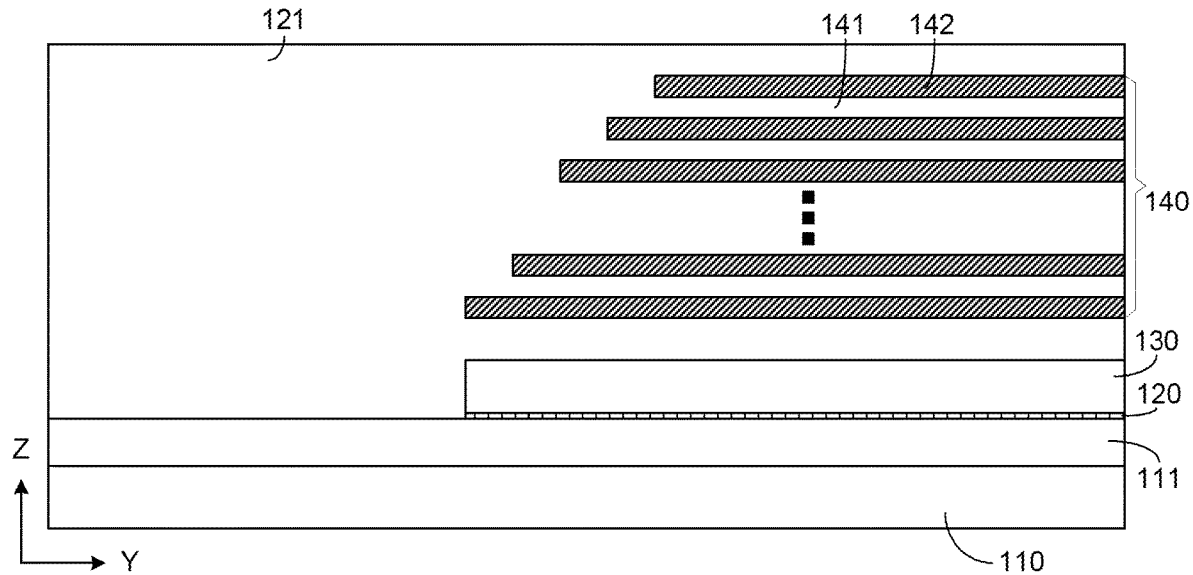

FIG. 2 shows a schematic cross-sectional view of the 3D array device 100 according to aspects of the present disclosure. As shown in FIG. 2, after the layer stack 140 is formed, a staircase formation process is performed to trim a part of the layer stack 140 into a staircase structure. Any suitable etching processes, including dry etch and/or wet etch process, may be used in the staircase formation process. For example, the height of the staircase structure may increase in a stepwise manner along the Y direction. A dielectric layer 121 is deposited to cover the staircase structure, the doped region 111, and the substrate 110. As shown in FIG. 2, the layer stack 140, the sacrificial layer 130, and the cover layer 120 are removed in a region on a side of the staircase structure, e.g., on the left side of the staircase structure. The region may be viewed as a contact region where interconnect contacts connected to contact pads may be configured or an opening for contact pads may be arranged. The word "connected" as used herein, indicates electrically connected. The contact region contains a portion of the dielectric layer 121 and thus is a dielectric region. In some aspects, the cover layer 120 is not etched away in the staircase formation process and a portion of the cover layer 120 may be buried under the dielectric layer 121 in the contact region.

Figure 3:
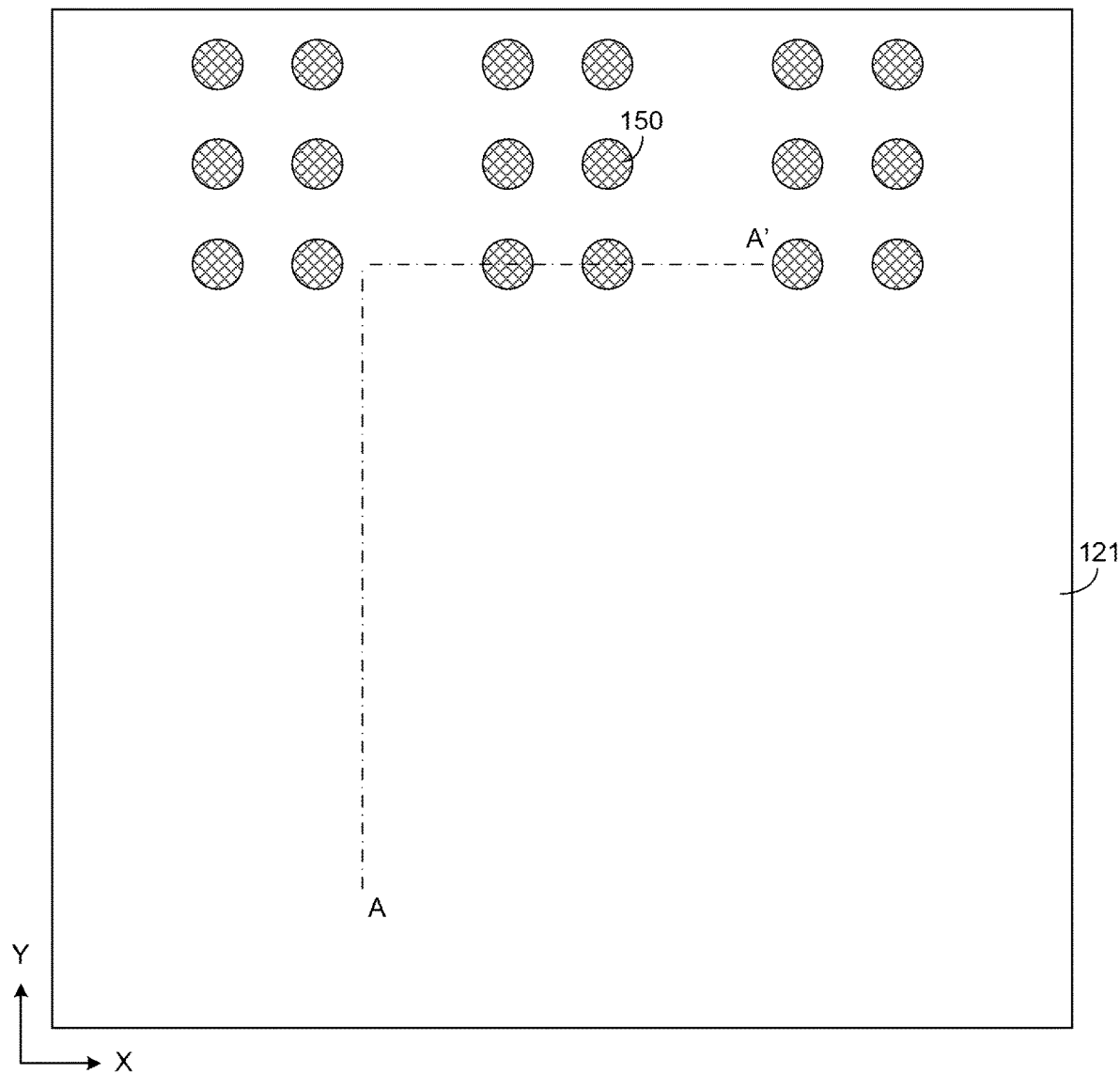
FIGS. 3 and 4 illustrate a top view and a cross-sectional view of the 3D array device shown in FIG. 2 after channel holes are formed according to various aspects of the present disclosure.
Figure 4:
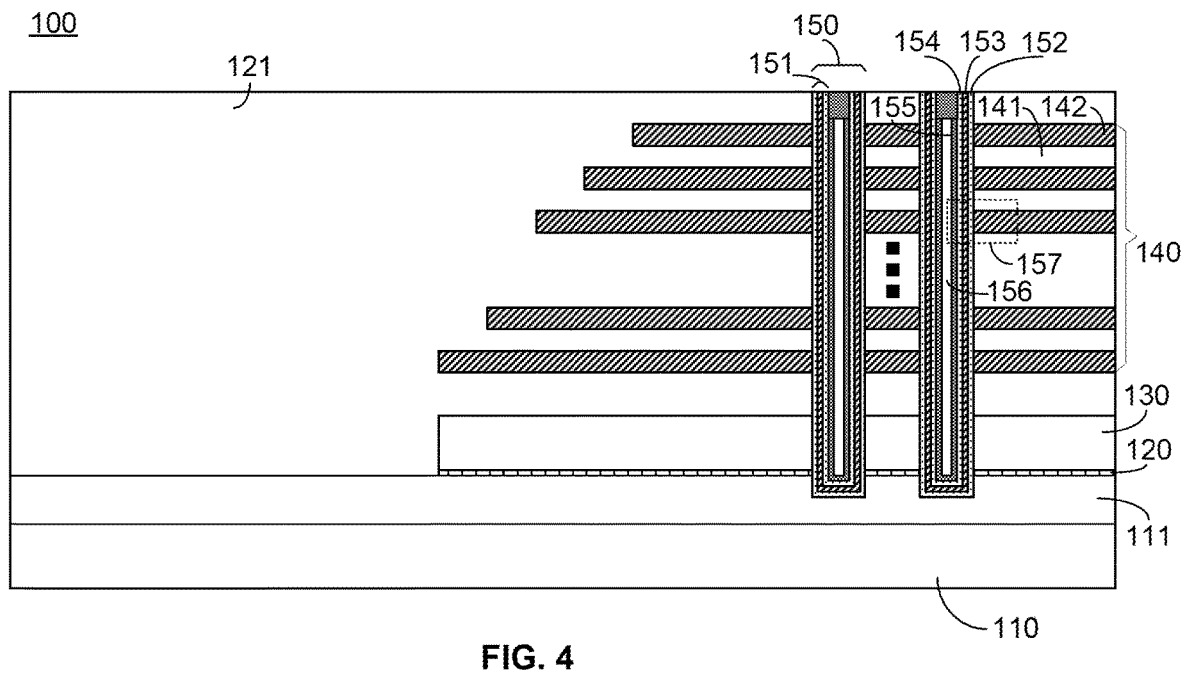
Figure 5A:
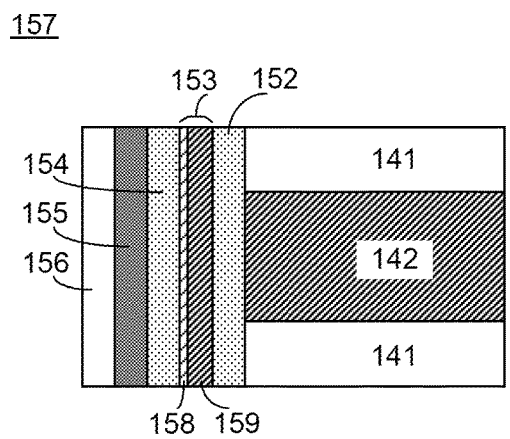
FIGS. 5A and 5B illustrates enlarged views of an exemplary portion of the 3D memory device shown in FIG. 4 according to various embodiments of the present disclosure.
Figure 5B:
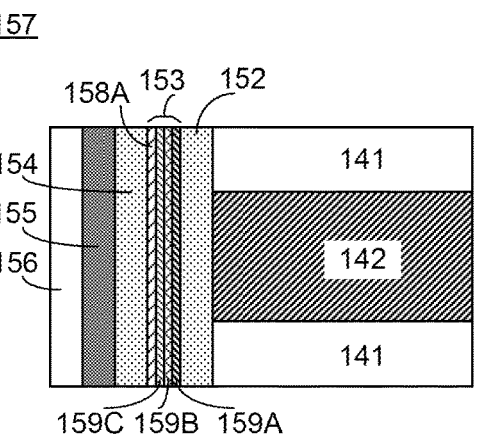

FIGS. 3 and 4 show a schematic top view and a schematic cross-sectional view of the 3D array device 100 after channel holes 150 are formed and then filled with layer structures according to aspects of the present disclosure. FIGS. 5A and 5B illustrate enlarged views of a portion 157 of the 3D array device 100. The cross-sectional view shown in FIG. 4 is taken along a line AA' of FIG. 3. The quantity, dimension, and arrangement of the channel holes 150 shown in FIGS. 3 and 4 and in other figures in the present disclosure are exemplary and for description purposes, although any suitable quantity, dimension, and arrangement may be used for the disclosed 3D array device 100 according to various aspects of the present disclosure.

As shown in FIGS. 3 and 4, the channel holes 150 are arranged to extend in the Z direction or in a direction approximately perpendicular to the substrate 110 and form an array of a predetermined pattern (not shown) in the X-Y plane. The channel holes 150 may be formed by, for example, a dry etch process or a combination of dry and wet etch processes. Other processes may also be performed, such as a patterning process involving lithography, cleaning, and/or chemical mechanical polishing (CMP). The channel holes 150 may have a cylinder shape or pillar shape that extends through the layer stack 140, the sacrificial layer 130, the cover layer 120, and partially penetrates the doped region 111. After the channel holes 150 are formed, a functional layer 151 is deposited on the sidewall and bottom of the channel hole. The functional layer 151 includes a blocking layer 152 on the sidewall and bottom of the channel hole to block an outflow of charges, a charge trap layer 153 on a surface of the blocking layer 152 to store charges during an operation of the 3D array device 100, and a tunnel insulation layer 154 on a surface of the charge trap layer 153. The blocking layer 152 may include one or more layers that may include one or more materials. The material for the blocking layer 152 may include silicon oxide, silicon nitride, silicon oxynitride, a high-k dielectric material such as aluminum oxide or hafnium oxide, or another wide bandgap material. The charge trap layer 153 may include one or more layers that may include one or more materials. The materials for the charge trap layer 153 may include polysilicon, silicon nitride, silicon oxynitride, nanocrystalline silicon, a high-k dielectric material such as aluminum oxide or hafnium oxide, or another wide bandgap material. The tunnel insulation layer 154 may include one or more layers that may include one or more materials. The material for the tunnel insulation layer 154 may include silicon oxide, silicon nitride, silicon oxynitride, a high-k dielectric material such as aluminum oxide or hafnium oxide, or another wide bandgap material.

Further, a channel layer 155 is deposited on the tunnel insulation layer 154. The channel layer 155 is also referred to as a "semiconductor channel" and includes polysilicon in some aspects. Optionally, the channel layer 155 may include amorphous silicon. Like the channel holes, the channel layer 155 also extends through the layer stack 140 and into the doped region 111. The blocking layer 152, the charge trap layer 153, the tunnel insulation layer 154, and the channel layer 155 may be deposited by, e.g., CVD, PVD, ALD, or a combination of two or more of these processes. The channel hole 150 is filled by an oxide material 156 after the channel layer 155 is formed. The structure formed in a channel hole 150, including the functional layer 151 and channel layer 155, may be considered as a channel structure.

In some cases, the functional layer 151 includes an oxide-nitride-oxide (ONO) structure. That is, the blocking layer 152 is a silicon oxide layer, the charge trap layer 153 is a silicon nitride layer, and the tunnel insulation layer 154 is another silicon oxide layer. The silicon oxide layer and silicon nitride layer are deposited via different processes. After the ONO structure is made, some defects, such as shallow traps, may form in the interface between the tunnel insulation layer 154 and the charge trap layer 153 (i.e., between the silicon oxide and silicon nitride layers). Further, subsequent thermal annealing processes may cause more defects to form in the interface. These defects in the silicon oxide and silicon nitride interface may lead to charge leakage issues, change of the voltage threshold of a memory cell in program state, and charge retention issues, constituting a reliability threat for the 3D array device 100.

To reduce the defects and improve the interface quality, the silicon nitride layer of an ONO structure is thermally annealed before growing the subsequent silicon oxide layer. The thermal annealing process lasts for a predetermined time period with elevated temperatures. In some aspects, the newly formed silicon nitride layer is exposed to an environment (e.g., a gaseous environment) containing carbon substances and nitrogen substances in the thermal annealing process. For example, the silicon nitride layer may be exposed in a chamber containing triethylamine ($N(CH_2CH_3)_3$) vapor or methylamine ($CH_3NH_2$) gas, which are two examples of the carbon and nitrogen substance. After the thermal annealing, the subsequent silicon oxide layer of the ONO structure is deposited on the silicon nitride layer. Similar to descriptions above, the silicon nitride and silicon oxide layers may be formed by, e.g., CVD, PVD, ALD, or any combination thereof.

As used herein, the term "carbon element" indicates a pure substance consisting only of carbon atoms with the symbol C and atomic number 6 and the term "nitrogen element" indicates a pure substance consisting only of nitrogen atoms with the symbol N and atomic number 7. In addition, the terms "carbon substances and nitrogen substances" and "carbon and nitrogen substances" each indicate substances that contain carbon elements and nitrogen elements.

Because the silicon nitride layer of the ONO structure is annealed in an environment containing carbon and nitrogen substances, some carbon elements are transferred from the environment to the exposed surface of the silicon nitride layer. Then, certain carbon elements diffuse into the surface region of the silicon nitride layer and get adsorbed in the surface region. For example, carbon elements may be combined with free radicals in the surface region to form mixtures that contain carbon with silicon and/or nitrogen. The mixture is attached to or embedded in the surface region. The adsorbed carbon elements modify the physical and chemical properties of the surface region of the silicon nitride layer. The modified surface region that contains silicon nitride and a certain amount of carbon elements may be referred to as a carbon region. Subsequently, a silicon oxide layer (i.e., the tunnel insulation layer 154) is grown on a surface of the carbon region to form the ONO structure. As shown schematically in FIG. 5A, the charge trap layer 153 (i.e., a silicon nitride layer) has a portion 158 that represents the carbon region and a portion 159 that represents the rest of the charge trap layer 153. In some aspects, the portion 159 is a region that contains silicon nitride but does not contain carbon elements. The portion 158 reflects the modified surface region of the charge trap layer 153 before the tunnel insulation layer 154 is deposited. As such, the portion 158 is adjacent to and physically contacts the tunnel insulation layer 154 with regard to the blocking layer 152. The portion 159 is adjacent and next to the portion 158.

The portion 158 is thinner or much thinner than the portion 159. In some aspects, the thickness of the portion 158 may be about 0.5 nanometer and around one fifth to one fortieth of that of the charge trap layer 153 as measured in a direction perpendicular to the charge trap layer. The interface between the layers 154 and 153 becomes an interface between the layer 154 and portion 158, that is, between the silicon oxide layer and the carbon region that contains a certain amount of carbon elements or mixtures of carbon with silicon and/or nitrogen. The carbon elements in the portion 158 reduce defects in the interface. For example, shallow traps may be reduced by the carbon elements. In addition, the carbon elements in the portion 158 may decrease the interfacial shear stress caused by the mismatch of thermal expansion coefficients of the layers 154 and 153 (i.e., a silicon oxide layer and a silicon nitride layer), which reduces defects created by thermal annealing in the following processes. Thus, the yield and reliability of the 3D array device 100 may be improved by modifying the interface between the tunnel insulation layer 154 and charge trap layer 153 with carbon elements.

Optionally, the functional layer 151 may have a structure different from the ONO configuration. In some aspects, as shown schematically in FIG. 5B, the charge trap layer 153 may include a portion 158A that is a carbon region and multiple layers 159A, 159B, and 159C. For example, the blocking layer 152 may be a silicon oxide layer, the tunnel insulation layer 154 may be another silicon oxide layer, while the charge trap layer 153 may be a multilayer corresponding to the portion 158A and layers 159A-159C. Optionally, the multilayer may contain a silicon nitride layer, a layer of a high-k dielectric material (e.g., aluminum oxide or hafnium oxide), and a SiON layer. Methods similar to descriptions above may be used to create an interface between the tunnel insulation layer 154 and the carbon region (i.e., the portion 158A) that contains a certain amount of carbon elements. For example, after the multilayer is formed, a thermal annealing process may be performed with the surface of the multilayer exposed to an environment containing carbon and nitrogen substances. When the multilayer is made by growing the SiON layer, the high-k material layer, and the silicon nitride layer consecutively on a surface of the blocking layer 152, the surface of the layer 153 is silicon nitride. After the thermal annealing is completed, the surface region is modified into the portion 158A that contains carbon elements and silicon nitride, such as silicon nitride and mixtures of carbon with silicon and/or nitrogen. When the multilayer is made by growing the silicon nitride layer, the high-k material layer, and the SiON layer consecutively, the surface of the layer 153 is SiON. After the thermal annealing, the surface region is transformed into the portion 158A that contains carbon elements and SiON, such as SiON and mixtures of carbon with silicon, oxygen, and/or nitrogen. In both cases, the interface between the tunnel insulation layer 154 and the charge trap layer 153 is an interface between silicon oxide and a region modified by carbon elements. As such, the portion 158A is a region containing carbon elements, while the layers 159A-159C may not contain carbon elements. In some aspects, the thickness of the portion 158A may be about 0.5 nanometer and around one fifth to one fortieth of that of the charge trap layer 153. Because of the surface modification by carbon elements, defects in the interface of layers 154 and 153 may be reduced and the interface quality may be improved for better yield and reliability.

Besides thermal annealing, the portion 158 or 158A may also be fabricated by, e.g., CVD, PVD, ALD, or any combination thereof. In such a case, the portion 158 or 158A may be a thin film that is a carbon compound containing carbon elements or carbon and nitrogen elements. The thin film may be deposited on a surface of the blocking layer 152, such as a surface of silicon nitride or SiON, at predetermined temperatures. As such, the interface between the layers 154 and 153 becomes an interface between silicon oxide and the carbon compound. Consequently, defects in the interface may be reduced. In some other cases, the portion 159 or layer 159C may also contain materials other than silicon nitride and SiON, such as certain materials containing carbon substances.

In the following descriptions, the ONO structure is used exemplarily for the blocking layer 152, the charge trap layer 153, and the tunnel insulation layer 154.

Referring to FIG. 4, the channel holes 150 are etched after the staircase structure is formed. Optionally, the channel holes 150 may also be formed before the staircase formation process. For example, after the layer stack 140 is fabricated as shown in FIG. 1, the channel holes 150 may be formed and then the functional layer 151 and the channel layer 155 may be deposited. After the channel holes 150 are filled with the oxide material 156, the staircase formation process may be performed to form the staircase structure.

Figure 6:
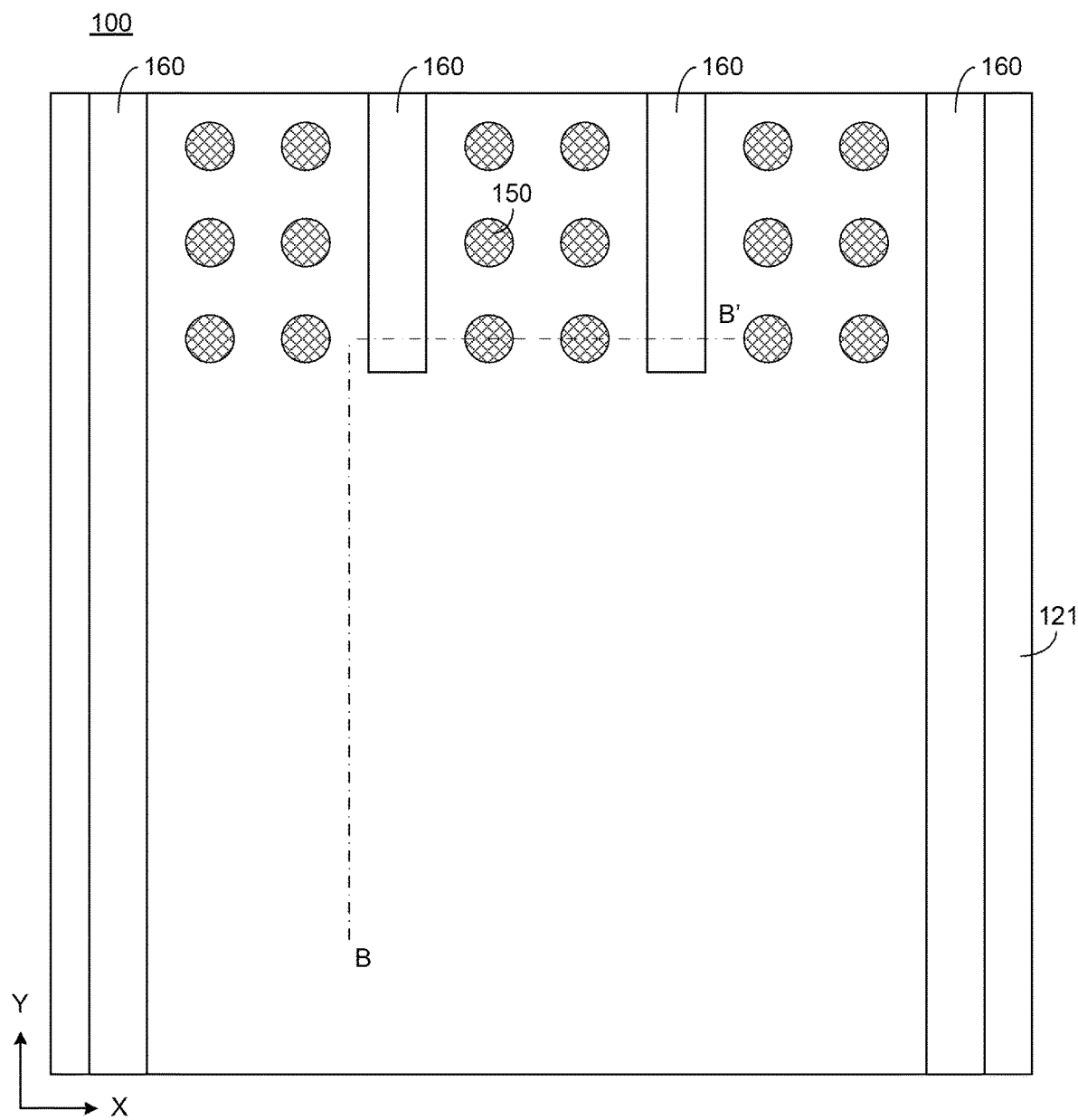
FIGS. 6 and 7 illustrate a top view and a cross-sectional view of the 3D array device shown in FIGS. 3 and 4 after gate line slits are formed according to various aspects of the present disclosure.
Figure 7:
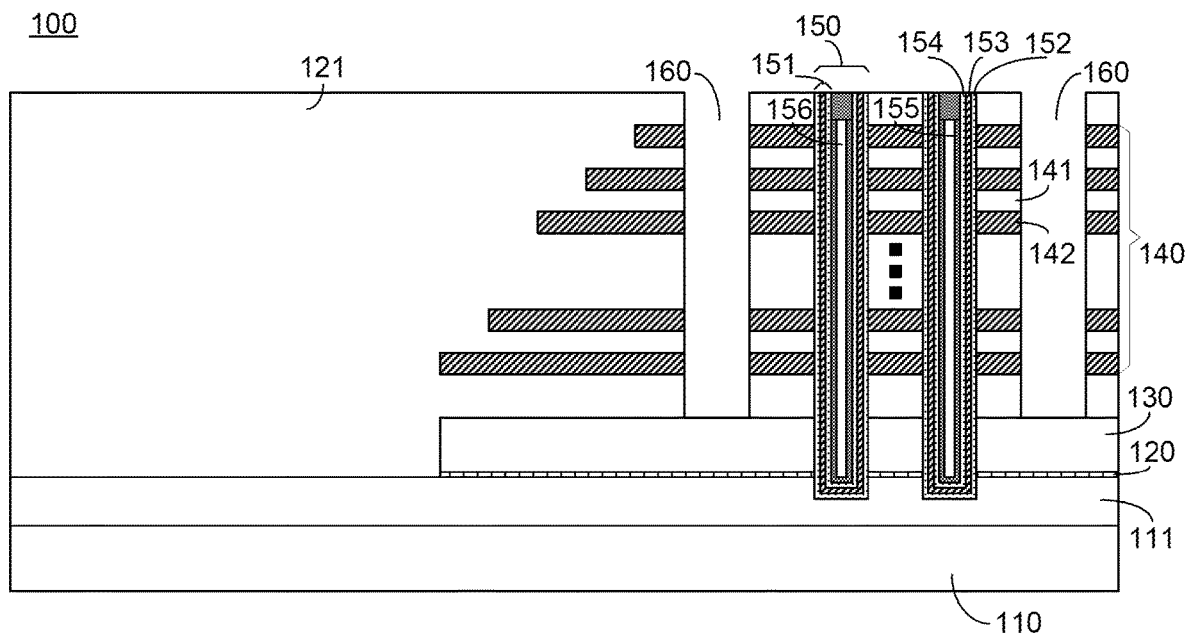

FIGS. 6 and 7 show a schematic top view and a schematic cross-sectional view of the 3D array device 100 after gate line slits 160 are formed according to aspects of the present disclosure. The cross-sectional view shown in FIG. 7 is taken along a line BB' of FIG. 6. A gate line slit may also be referred to as a gate line slit structure. The 3D array device 100 has a great number of channel holes 150 arranged in memory planes (not shown). Each memory plane is divided into memory blocks (not shown) and memory fingers by the gate line slits. For example, the configuration of the channel holes 150 as shown in FIG. 6 reflects memory fingers between the gate line slits 160.

The gate line slits 160 may be formed by, for example, a dry etch process or a combination of dry and wet etch processes. As shown in FIGS. 6 and 7, the gate line slits 160 extend, e.g., in the X and Y directions horizontally, and extend through the layer stack 140 and reach or partially penetrate the sacrificial layer 130 in the Z direction or in a direction approximately perpendicular to the substrate 110. As such, at the bottom of the gate line slit 160, the sacrificial layer 130 is exposed. Then, spacer layers (not shown) may be deposited on the sidewall and bottom of the gate line slit 160 by CVD, PVD, ALD, or a combination thereof. The spacer layers are configured to protect the first and second dielectric layers 141 and 142 and may include, for example, silicon oxide and silicon nitride.

After the spacer layers are deposited, selective etching is performed such that parts of the spacer layers at the bottom of the gate line slits 160 are removed by dry etch or a combination of dry etch and wet etch. The sacrificial layer 130 is exposed again. Subsequently, a selective etch process, e.g., a selective wet etch process, is performed to remove the sacrificial layer 130. Removal of the sacrificial layer 130 creates a cavity and exposes the cover layer 120 and bottom portions of the blocking layers 152 formed in the channel holes 150. Further, multiple selective etch processes, e.g., multiple selective wet etch processes, are performed to remove the exposed portions of the blocking layer 152, the charge trap layer 153, and the tunnel insulation layer 154 consecutively, which exposes bottom side portions of the channel layer 155.

When the cover layer 120 is silicon oxide and/or silicon nitride, the cover layer 120 may be removed when the bottom portions of the functional layers 151 are etched away. In certain aspects, the cover layer 120 includes a material other than silicon oxide or silicon nitride, and the cover layer 120 may be removed by one or more additional selective etch processes. Removal of the cover layer 120 exposes the top surface of the doped region 111.

After the etch processes, the doped region 111 and side portions of the channel layers 155 close to the bottom of the channel hole 150 are exposed in the cavity left by etching away the sacrificial layer 130 and the cover layer 120. The cavity is filled by a semiconductor material, e.g., polysilicon, to form a semiconductor layer 131, e.g., by a CVD and/or ALD deposition process. The semiconductor layer 131 is n-doped, formed on the exposed surface of the doped region 111 and on sidewalls or side portions of the channel layers 155, and connected to the doped region 111 and the channel layers 155.

Optionally, a selective epitaxial growth is performed such that a layer of single crystalline silicon may be grown on the exposed surface of the doped region 111 and a polysilicon layer may be grown on the exposed surface of the channel layer 155. Thus, the semiconductor layer 131 may include adjoined layers of single crystalline silicon and polysilicon.

Figure 8:
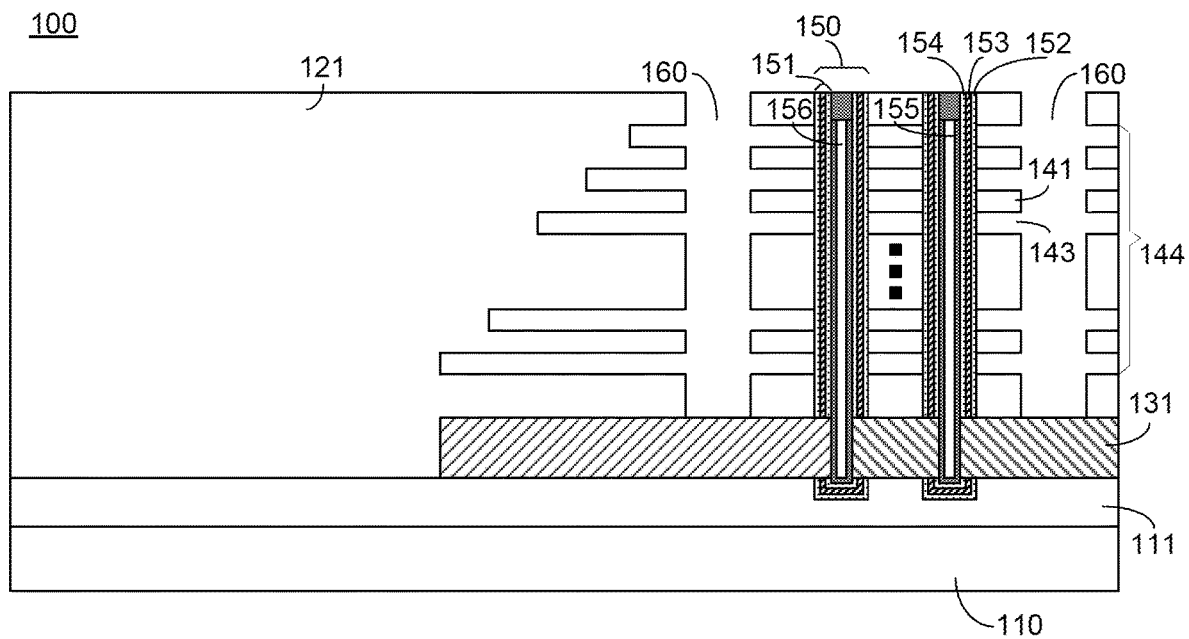
FIGS. 8, 9, and 10 illustrate cross-sectional views of the 3D array device shown in FIGS. 6 and 7 at certain stages in the fabrication process according to various aspects of the present disclosure.

When the bottom parts of the functional layer 151 and the cover layer 120 are etched, some spacer layers are etched away and the rest spacer layers remain on the sidewall of the gate line slits 160 to protect the first and second dielectric layers 141 and 142. After the semiconductor layer 131 is formed, the remaining spacer layers are removed in a selective etch process, e.g., a selective wet etch process, which exposes the sides of the second dielectric layer 142 around the gate line slits 160. In some aspects, the innermost spacer layer, which is in contact with the sidewall, is silicon nitride. Because the second dielectric layers 142 are also silicon nitride, the innermost spacer layer and the second dielectric layers 142 may be removed together during the etch process, leaving cavities 143 between the first dielectric layers 141, as shown in FIG. 8. As such, the layer stack 140 is changed into a layer stack 144.

Figure 9:
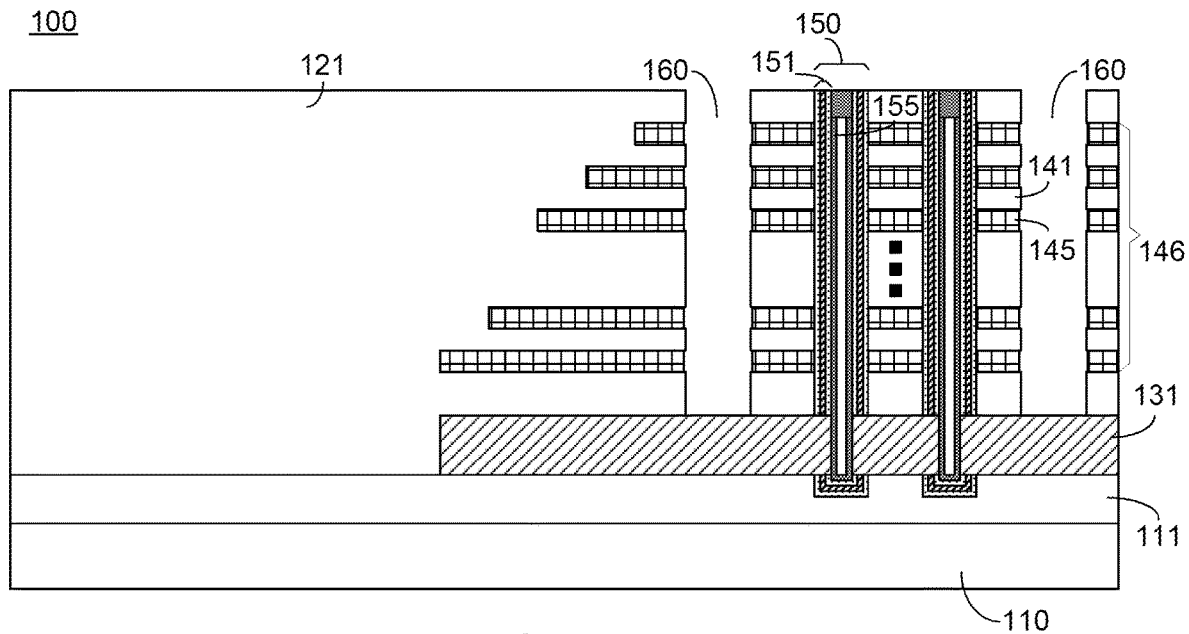

Further, a conductive material such as tungsten (W) is grown to fill the cavities 143 left by the removal of the second dielectric layers 142, forming conductor layers 145 between the first dielectric layers 141. After the conductor layers 145 are fabricated, the layer stack 144 is converted into a layer stack 146, as shown in FIG. 9. The layer stack 146 includes the first dielectric layers 141 and the conductor layers 145 that are alternatingly stacked over each other. In some aspects, before metal W is deposited in the cavities 143, a dielectric layer (not shown) of a high-k dielectric material such as aluminum oxide may be deposited, followed by deposition of a layer of a conductive material such as titanium nitride (TiN) (not shown). Further, metal W is deposited to form the conductor layers 145. CVD and/or ALD may be used in the deposition processes. Alternatively, another conductive material, such as cobalt (Co), copper (Cu), aluminum (Al), titanium (Ti), tantalum (Ta), tantalum nitride (TaN), doped silicon, or any combination thereof, may be used to form the conductor layers 145.

Referring to FIG. 9, a portion of each functional layer 151 in a channel hole 150 is between a portion of one of the conductor layers 145 and a portion of a channel layer 155 in the channel hole 150. Each conductor layer 145 is configured to connect rows of NAND memory cells in an X-Y plane and is configured as a word line for the 3D array device 100. The channel layer 155 formed in the channel hole 150 is configured to connect a column or a string of NAND memory cells along the Z direction and configured as a bit line for the 3D array device 100. As such, a portion of the functional layer 151 in the channel hole 150 in the X-Y plane, as a part of a NAND memory cell, is arranged between a conductor layer 145 and a channel layer 155, i.e., between a word line and a bit line. The functional layer 151 may also be considered as disposed between the channel layer 155 and the layer stack 146. A portion of the conductor layer 145 that is around a portion of the channel hole 150 functions as a control gate or gate electrode for a NAND memory cell. The 3D array device 100 can be considered as including a 2D array of strings of NAND cells (such a string is also referred to as a "NAND string"). Each NAND string contains multiple NAND memory cells and extends vertically toward the substrate 110. The NAND strings form a 3D array of the NAND memory cells through the layer stack 146 over the substrate 110.

Figure 10:
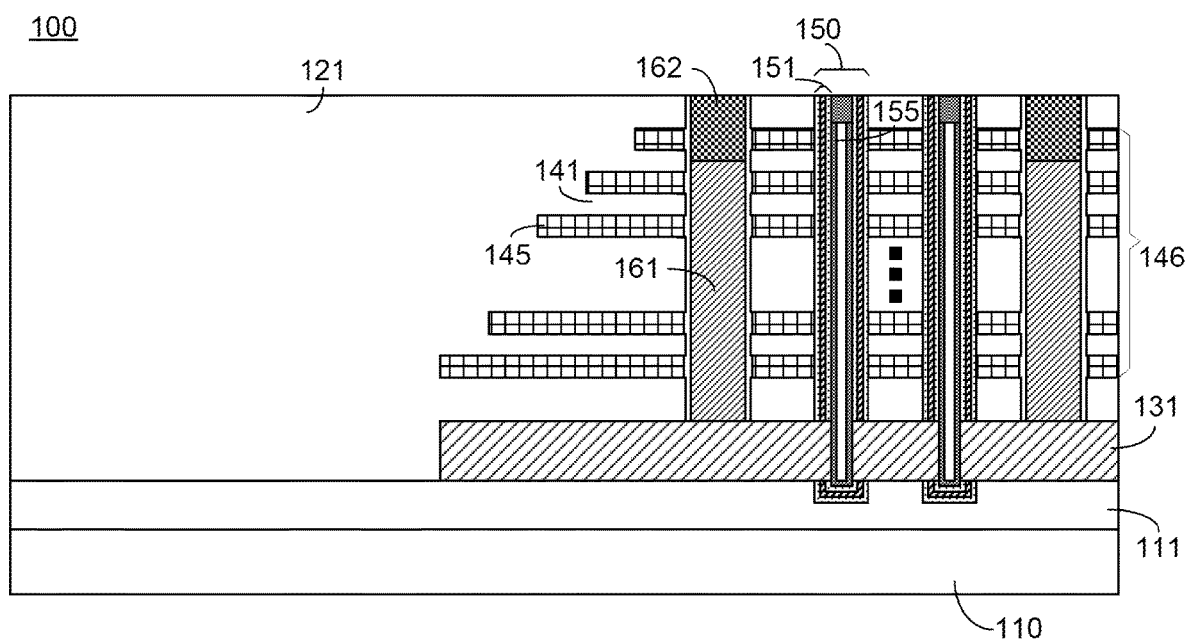

After the conductor layers 145 are grown in the cavities 143, a dielectric layer (e.g., a silicon oxide layer) may be deposited on the sidewalls and bottom surfaces of the gate line slits 160 by CVD, PVD, ALD, or a combination thereof. A dry etch process or a combination of dry etch and wet etch processes may be performed to remove the dielectric layer at the bottom of the gate line slits to expose parts of the semiconductor layer 131. The gate line slits are filled with a conductive material 161 (e.g., doped polysilicon) and a conductive plug 162 (e.g., metal W). The conductive material 161 in the gate line slit extends through the layer stack 146 and contacts the semiconductor layer 131, as shown in FIG. 10. The word "contact" as a verb indicates electrically contacting an object as used herein. The filled gate line slits become an array common source for the 3D array device 100 in some aspects. Optionally, forming the array common source in the gate line slits includes depositing an insulation layer, a conductive layer (such as TiN, W, Co, Cu, or Al), and then a conductive material such as doped polysilicon.

Figure 11:
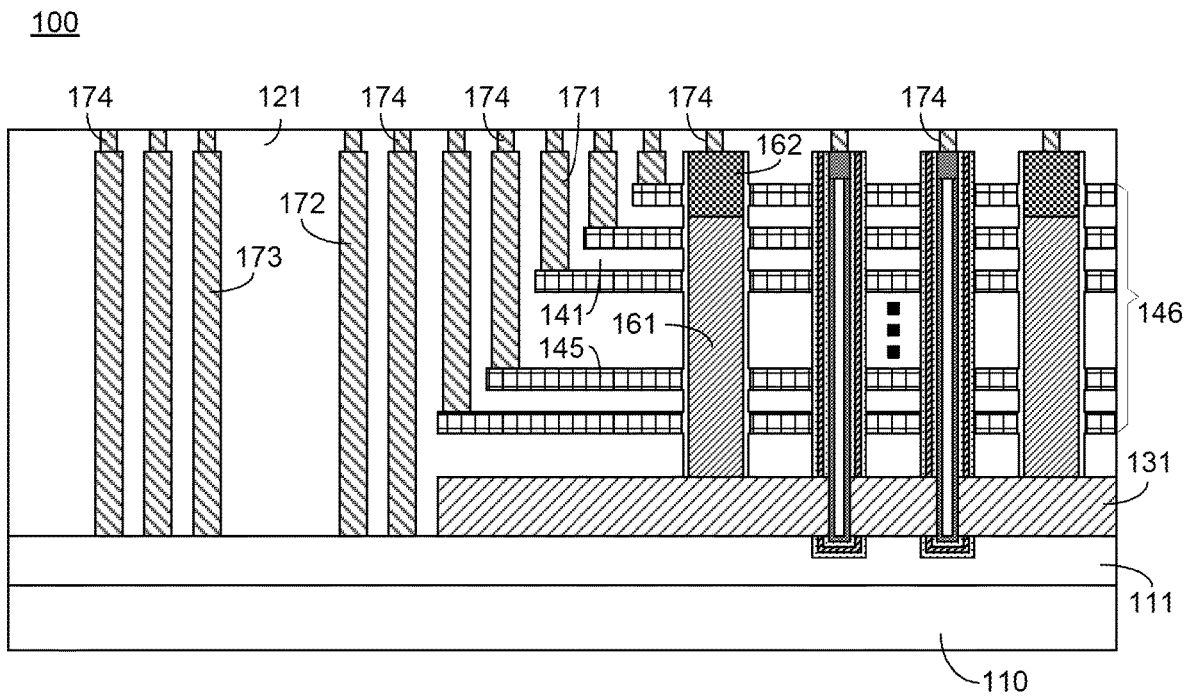
FIGS. 11 and 12 illustrate cross-sectional views of the 3D array device shown in FIG. 10 at certain stages in the fabrication process according to various aspects of the present disclosure.
Figure 12:
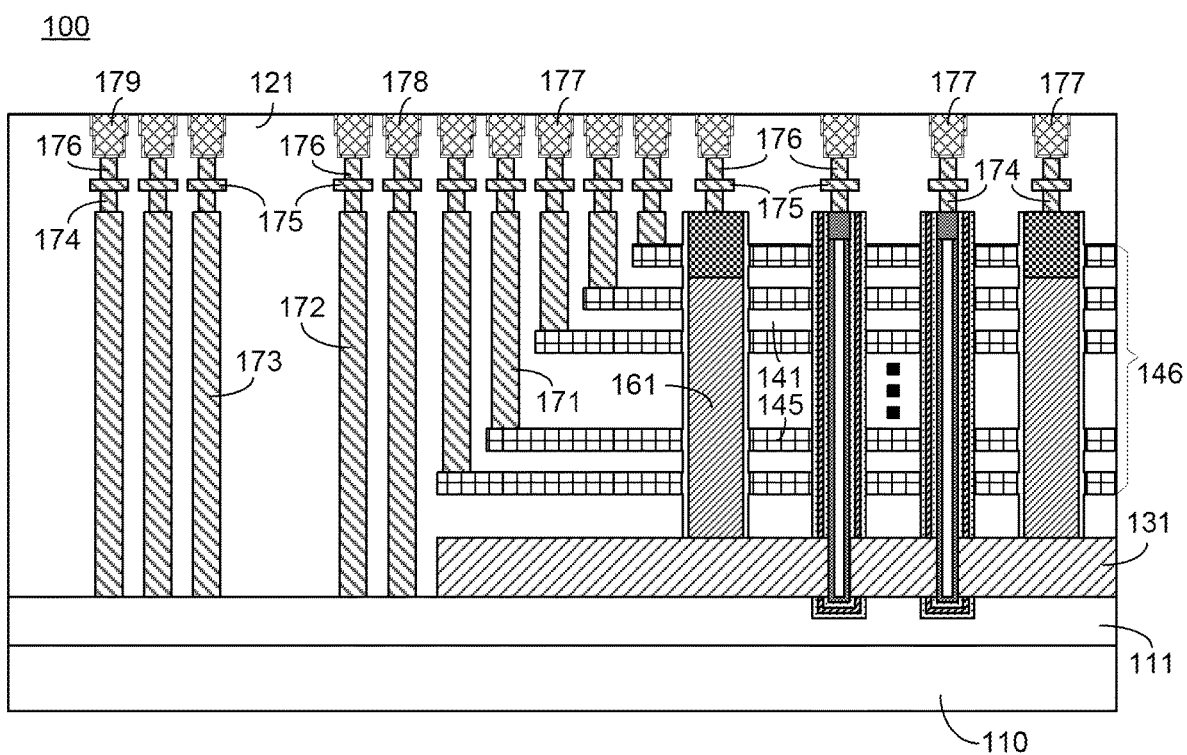

FIGS. 11 and 12 show schematic cross-sectional views of the 3D array device 100 at certain stages after contacts, vias, conductor layers, and connecting pads are formed according to aspects of the present disclosure. After the gate line slits 160 are filled and the array common source is formed as shown in FIG. 10, openings for word line contacts 171 and interconnect contacts 172 and 173 may be formed respectively by, e.g., a dry etch process or a combination of dry and wet etch processes. The contacts 171-173 are arranged as interconnects for the 3D array device 100. The openings for the contacts 171-173 are respectively filled with a conductive material by CVD, PVD, ALD, electroplating, electroless plating, or any combination thereof. As shown in FIG. 11, the interconnect contacts 172 and 173 are formed in the contact region (i.e., a dielectric region) and beside the layer stack 146 and the NAND memory cells. The staircase structure is disposed between the interconnect contacts 172-173 and the stack layer 146, i.e., between the interconnect contacts 172-173 and the NAND memory cells. In some aspects, the interconnect contacts 172-173 extend to reach the doped region 111. Alternatively, the interconnect contacts 172-173 may extend to a level above the doped region 111 in the dielectric layer 121. The conductive material for the contacts 171-173 may include W, Co, Cu, Al, or a combination thereof. Optionally, a layer of a conductive material (e.g., TiN) may be deposited as a contact layer before another conductive material is deposited when the contacts 171-173 are fabricated respectively.

Further, a CVD or PVD process is performed to deposit a dielectric material (e.g., silicon oxide or silicon nitride) on the 3D array device 100, and the dielectric layer 121 becomes thicker. Openings for vias 174 are formed by a dry etch process or a combination of dry and wet etch processes. The openings may be subsequently filled with a conductive material such as W, Co, Cu, Al, or a combination thereof to form the vias 174, as shown in FIG. 11. CVD, PVD, ALD, electroplating, electroless plating, or a combination thereof may be performed. The vias 174 are connected to the contacts 171-173, the upper ends of corresponding NAND strings, and the plugs 162 of the array common source. Optionally, a layer of a conductive material (e.g., TiN) may be deposited first before filling the openings to form the vias 174.

Further, conductor layers 175 for interconnect may be grown by CVD, PVD, ALD, electroplating, electroless plating, or a combination thereof. The conductor layers 175 are deposited over and contact the vias 174, respectively, and include a conductive material such as W, Co, Cu, Al, or a combination thereof.

Similar to the formation of the vias 174, vias 176 are made over the conductor layers 175. For example, a dielectric material may be deposited to cover the conductor layers 175 and make the dielectric layer 121 thicker, openings for vias 176 may be formed, and the openings may be subsequently filled with a conductive material to form the vias 176.

Further, a CVD or PVD process is performed to deposit a dielectric material (e.g., silicon oxide or silicon nitride) to cover the vias 176 and thicken the dielectric layer 121 further. Openings are made and then filled to form connecting pads 177, 178, and 179 that serve as interconnects with a peripheral device. As shown in FIG. 12, the connecting pads 177-179 are deposited over and contact the vias 176, respectively. As such, the connecting pads 177 are connected to the word line contacts 171, the upper ends of corresponding NAND strings, and the plugs 162, respectively. The connecting pads 178 and 179 are connected to the interconnect contacts 172 and 173, respectively. The connecting pads 177-179 may include a conductive material such as W, Co, Cu, Al, or a combination thereof. Optionally, a contact layer of a conductive material (e.g., TiN) may be deposited first before filling the openings to form the connecting pads 177-179.

Figure 13:
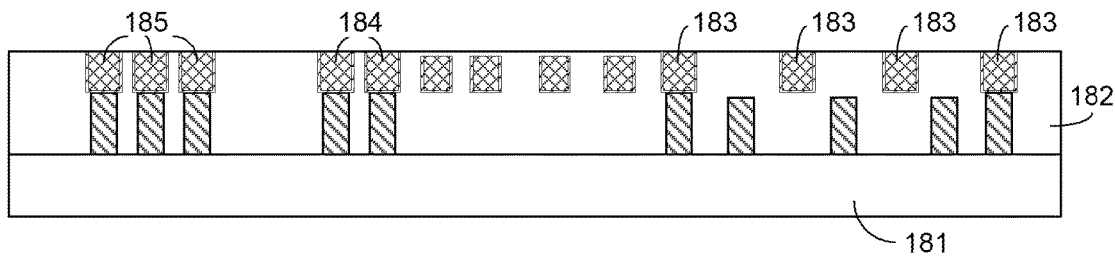
FIG. 13 illustrates a cross-sectional view of an exemplary peripheral device according to various aspects of the present disclosure.

FIG. 13 shows a schematic cross-sectional view of a peripheral device 180 according to aspects of the present disclosure. The peripheral device 180 is a part of a memory device and may also be referred to as a peripheral structure. The peripheral device 180 includes a substrate 181 that may include single crystalline silicon, Ge, SiGe, SiC, SOI, GOI, polysilicon, or a Group III-V compound such as GaAs or InP. Peripheral CMOS circuits (e.g., control circuits) (not shown) are fabricated on the substrate 181 and used for facilitating the operation of the array device 100. For example, the peripheral CMOS circuits may include metal-oxide-semiconductor field-effect transistors (MOSFETs) and provide functional devices such as page buffers, sense amplifiers, column decoders, and row decoders. A dielectric layer 182 is deposited over the substrate 181 and the CMOS circuits. Connecting pads (such as connecting pads 183, 184, and 185) and vias are formed in the dielectric layer 182. The dielectric layer 182 includes one or more dielectric materials such as silicon oxide and silicon nitride. The connecting pads 183-185 are configured as interconnects with the 3D array device 100 and may include a conductive material such as W, Co, Cu, Al, or a combination thereof.

For the 3D array device 100 and peripheral device 180, the bottom side of the substrate 110 or 181 may be referred to as the back side, and the side with the connecting pads 177-179, or 183-185 may be referred to as the front side or face side.

Figure 14:
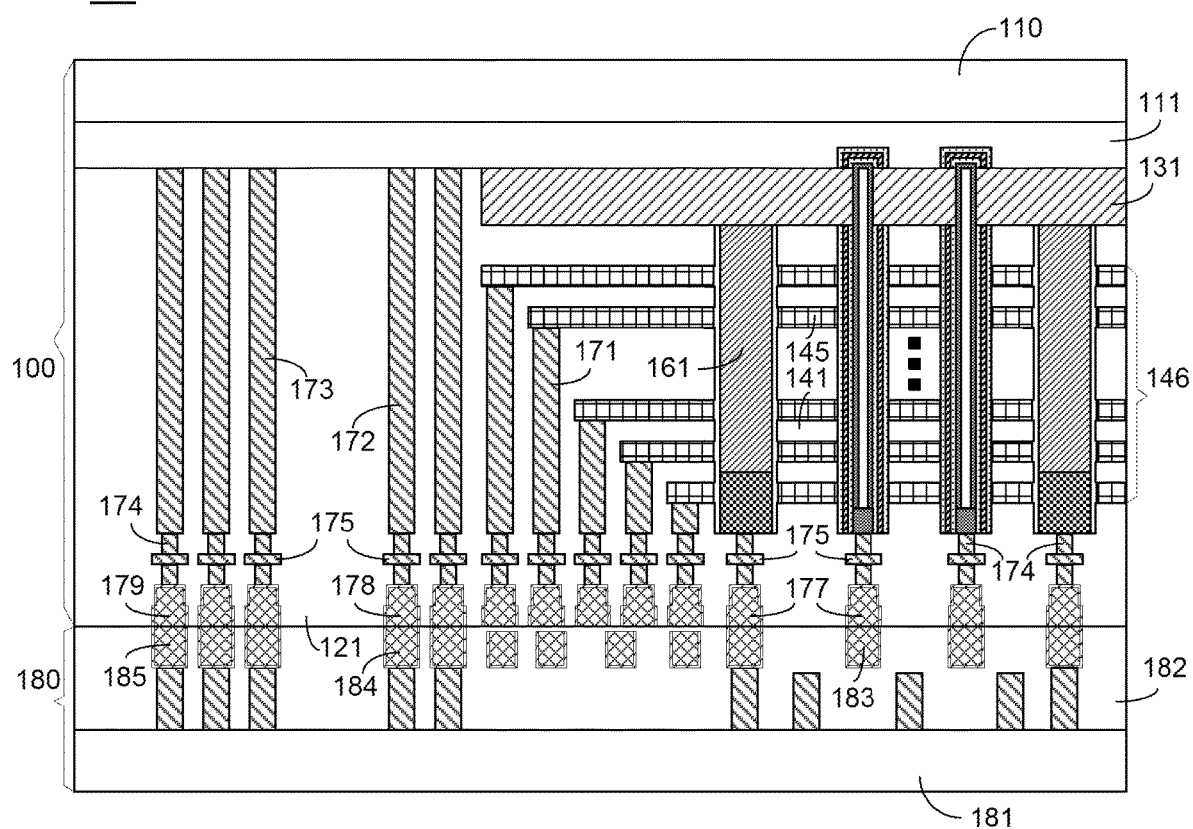
FIG. 14 illustrates a cross-sectional view of a 3D memory device after the 3D array device shown in FIG. 12 is bonded with the peripheral device shown in FIG. 13 according to various aspects of the present disclosure.

FIG. 14 schematically shows a fabrication process of an exemplary 3D memory device 190 in a cross-sectional view according to aspects of the present disclosure. The 3D memory device 190 includes the 3D array device 100 shown in FIG. 12 and the peripheral device 180 shown in FIG. 13.

The 3D array device 100 and peripheral device 180 are bonded by a flip-chip bonding method to form the 3D memory device 190, as shown in FIG. 14. In some aspects, the 3D array device 100 is flipped vertically and becomes upside down with the top surfaces of the connecting pads 177-179 facing downward. The two devices are placed together such that the 3D array device 100 is above the peripheral device 180. After an alignment is made, e.g., the connecting pads 177-179 are aligned with the connecting pads 183-185, respectively, the 3D array device 100 and peripheral device 180 are joined face to face and bonded together. The layer stack 146 and the peripheral CMOS circuits become sandwiched between the substrates 110 and 181 or between the doped region 111 and the substrate 181. In some aspects, a solder or a conductive adhesive is used to bond the connecting pads 177-179 with the connecting pads 183-185, respectively. As such, the connecting pads 177-179 are connected to the connecting pads 183-185, respectively. The 3D array device 100 and peripheral device 180 are in electrical communication after the flip-chip bonding process is completed.

Thereafter, other fabrication steps or processes are performed to complete fabrication of the 3D memory device 190. The other fabrication steps and processes are not reflected in FIG. 14 for simplicity. For example, from the bottom surface (after the flip-chip bonding), the substrate 110 of the 3D array device 100 is thinned by a thinning process, such as wafer grinding, dry etch, wet etch, CMP, or a combination thereof. A dielectric layer is grown over the doped region 111 by a deposition process (e.g., a CVD or PVD process). With similar methods as described above, vias and conductor layers are formed that connect the interconnect contacts 172 and 173, respectively. Further, a passivation layer is deposited and contact pads are formed that connect contacts 172 and/or 173. Further, additional fabrication steps or processes are performed. Details of the additional fabrication steps or processes are omitted for simplicity.

Figure 15:
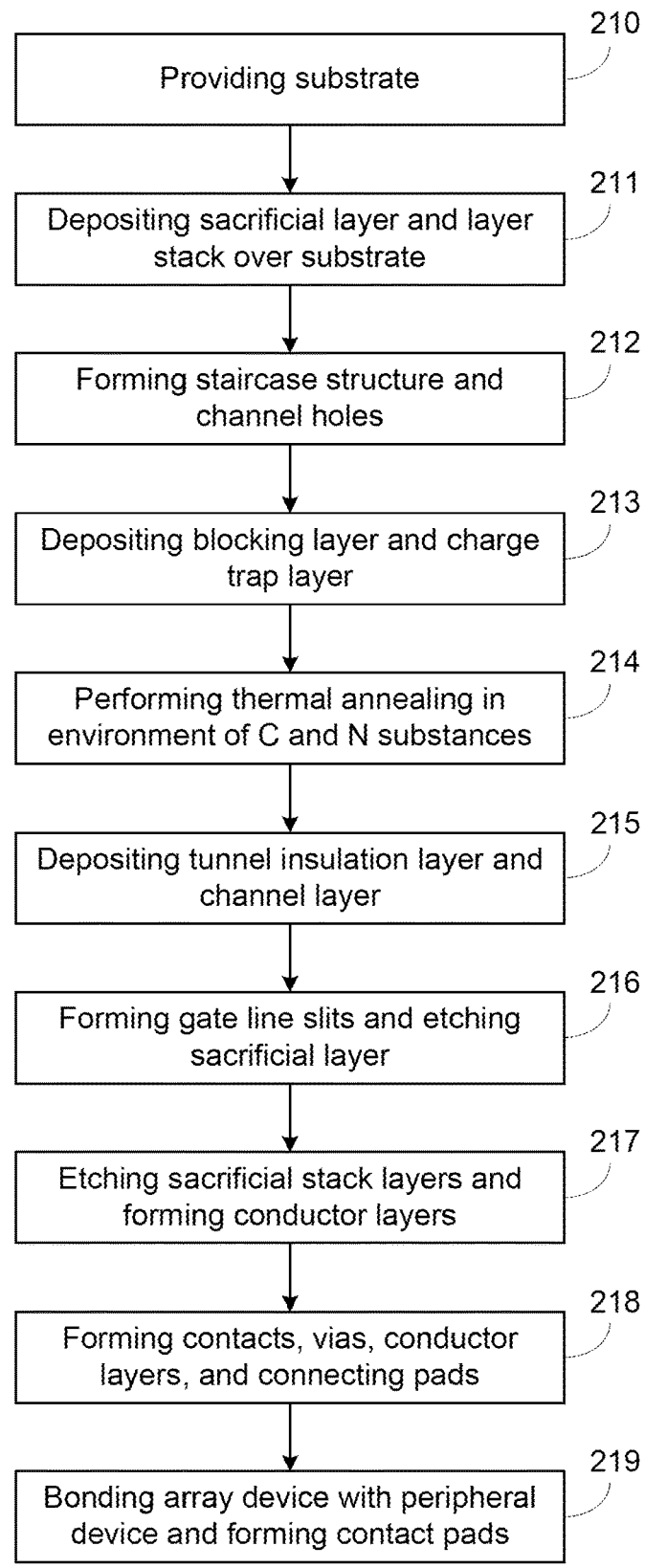
FIG. 15 illustrates a schematic flow chart of fabrication of a 3D memory device according to various aspects of the present disclosure.

FIG. 15 shows a schematic flow chart 200 for fabricating a 3D memory device according to aspects of the present disclosure. At 210, a substrate is provided for fabricating a 3D array device. At 211, a sacrificial layer is deposited over a top surface of the substrate for the 3D array device. The substrate includes a semiconductor substrate, such as a single crystalline silicon substrate. In some aspects, a cover layer is grown on the substrate before depositing the sacrificial layer. The cover layer includes a single layer or multiple layers that are grown sequentially over the substrate. For example, the cover layer may include silicon oxide, silicon nitride, and/or aluminum oxide. In some other aspects, the sacrificial layer may be deposited without first depositing the cover layer over the substrate. The sacrificial layer may include single crystalline silicon, polysilicon, silicon oxide, or silicon nitride.

Over the sacrificial layer, a layer stack of the 3D array device is fabricated. The layer stack includes a first stack layer and a second stack layer that are alternately stacked. The first stack layer includes a first dielectric layer and the second stack layer includes a second dielectric layer that is different than the first dielectric layer. In some aspects, one of the first and second dielectric layers is used as a sacrificial stack layer.

At 212, a staircase formation process is performed to convert a portion of the layer stack into a staircase structure. The staircase formation process includes multiple etches that are used to trim the portion of the layer stack into the staircase structure. A deposition process is performed to deposit a dielectric layer to cover the staircase structure. A part of the dielectric layer on a side of the staircase structure is used as a contact region where interconnect contacts for contact pads are configured. Further, channel holes are formed that extend through the layer stack and the sacrificial layer to expose portions of the substrate.

At 213, a blocking layer is deposited on the sidewall and bottom surface of each channel hole. A charge trap layer is deposited on a surface of the blocking layer. At 214, thermal annealing is performed to modify the surface region of the charge trap layer at predetermined temperatures for a prearranged time period. The surface of the charge trap layer is exposed to an environment (e.g., a gaseous environment) that contains carbon and nitrogen substances in the thermal annealing process. The thermal annealing modifies the surface region of the charge trap layer and transforms the surface region into a carbon region, i.e., a region containing a certain amount of carbon elements.

At 215, a tunnel insulation layer is deposited on a surface of the carbon region. The blocking layer, charge trap layer, and tunnel insulation layer collectively form a functional layer. Thereafter, a channel layer is deposited on a surface of the tunnel insulation layer and functions as a semiconductor channel. The channel hole is filled with a dielectric material after the channel layer is fabricated.

At 216, gate line slits of the 3D array device are formed. Along a direction vertical to the substrate, the gate line slits extend through the layer stack. After the gate line slits are etched, portions of the sacrificial layer are exposed. Thereafter, the sacrificial layer is etched away and a cavity is created above the substrate. The cavity exposes a bottom portion of the functional layer in the cavity. The cover layer is also exposed in the cavity, if it is deposited on the substrate. The layers of the functional layer exposed sequentially in the cavity, including the blocking layer, the charge trap layer, and the tunnel insulation layer, are etched away, respectively. That is, the bottom portion of the functional layer that is close to the substrate is removed. The cover layer, if deposited, is also etched away during the process to etch the bottom portion of the functional layer or in another selective etch process. Hence, a portion of the substrate and portions of the channel layers are exposed in the cavity.

Thereafter, a deposition process is performed to grow a semiconductor layer such as a polysilicon layer in the cavity. The semiconductor layer contacts the channel layers and the substrate.

In some aspects, the layer stack includes two dielectric stack layers and one of the stack layers is sacrificial. The sacrificial stack layers are etched away at 217 to leave cavities, which are then filled with a conductive material to form the conductor layers.

Further, a dielectric layer is deposited on the side wall and bottom surface of the gate line slits. Portions of the dielectric layer on the bottom surfaces are etched out selectively to expose the semiconductor layer. Conductive materials, such as TiN, W, Cu, Al, and/or doped polysilicon are deposited in the gate line slits to form an array common source that contacts the semiconductor layer.

At 218, etching and deposition processes are performed to form word line contacts, interconnect contacts, vias, conductor layers, and connecting pads for the 3D array device. At 219, a flip-chip bonding process is performed to bond the 3D array device and a peripheral device or fasten the 3D array device with a peripheral device to create the 3D memory device. In some aspects, the 3D array device is flipped upside down and positioned above the peripheral device. The connecting pads of the 3D array device and the peripheral device are aligned and then bonded. After the substrate of the 3D array device is thinned, etching and deposition processes are performed to form vias, conductor layers, and contact pads over the interconnect contacts in the contact region of the 3D array device. The contact pads are configured for wire bonding for connection with other devices.

Because of the thermal annealing process in an environment containing carbon and nitrogen substances, the carbon region is formed in the charge trap layer. The interface between the tunnel insulation layer and the charge trap layer becomes an interface between the tunnel insulation layer and the carbon region. As such, defects in the interface are reduced, the interface quality is enhanced, and consequently, the yield and reliability of the 3D memory device may be improved.

Figure 16:
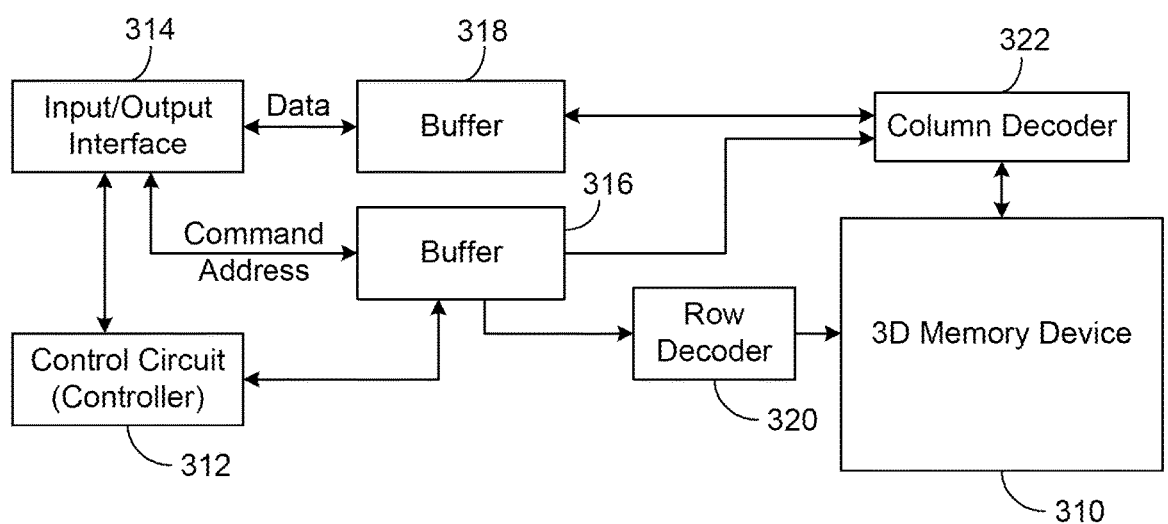
FIG. 16 illustrates a block diagram of a memory apparatus according to various embodiments of the present disclosure.

FIG. 16 shows a block diagram of a memory apparatus 300 according to embodiments of the present disclosure. Examples of the memory apparatus 300 may include data storage devices such as a solid-state drive (SSD), a universal flash storage (UFS) memory device, a multimedia card (MMC), an embedded multimedia card (eMMC), etc. The memory apparatus 300 may contain a 3D memory device such as the 3D memory device 190 illustrated above and shown in FIG. 14. As the 3D memory device 190 has improved yield and reliability due to the reasons described above, when the device 190 is used, the memory apparatus 300 may have improved yield and reliability, as well. As shown in FIG. 16, the memory apparatus 300 contains a 3D memory device 310 (e.g., the device 190) and a control circuit 312 that functions as a controller of the memory apparatus 300. The 3D memory device 310 may include one or more 3D memory arrays. The memory apparatus 300 further contains an input/output (I/O) interface 314, a buffer 316, a buffer 318, a row decoder 320, and a column decoder 322. The control circuit 312 implements various functions of the memory apparatus 300. For example, the control circuit 312 may implement read operations, write operations, and erase operations. The I/O interface 314, which may also be referred to as an I/O component or I/O connections, contains an I/O circuit to receive an input of command signals, address signals, and data signals to the memory apparatus 300 and transmit data and status information from the memory apparatus 300 to another device (e.g., a host device). The buffer 316 buffers or temporarily stores command/address signals, while the buffer 318 buffers or temporarily stores data signals. Optionally, the buffers 316 and 318 may be combined into a single buffering device. The row decoder 320 and column decoder 322 decode row and column address signals respectively for accessing the 3D memory device 310. The I/O interface 314 detects command signals, address signals, and data signals from the input. In some cases, the I/O interface 314 may transmit command and/or address signals to the buffer 316, and transmit data signals to the buffer 318. For simplicity, other components and functions of the memory apparatus 300 are omitted.

Although the principles and implementations of the present disclosure are described by using specific aspects in the specification, the foregoing descriptions of the aspects are only intended to help understand the present disclosure. In addition, features of aforementioned different aspects may be combined to form additional aspects. A person of ordinary skill in the art may make modifications to the specific implementations and application range according to the idea of the present disclosure. Hence, the content of the specification should not be construed as a limitation to the present disclosure.

What is claimed is:

1. A method for fabricating a three-dimensional (3D) memory device, comprising:
   providing a substrate;
   forming a layer stack over the substrate;
   forming a channel hole, the channel hole extending through the layer stack;
   forming a blocking layer on a sidewall of the channel hole;
   forming a charge trap layer on the blocking layer, the charge trap layer including a non-carbon region and a carbon region that comprises a certain amount of carbon elements, wherein the non-carbon region of the charge trap layer is in physical contact with the blocking layer, and forming the charge trap layer comprises forming a plurality of layers consecutively on a surface of the blocking layer for forming the non-carbon region, and the plurality of layers includes a silicon nitride layer, a layer of a high-k dielectric material, and a silicon oxynitride layer;
   forming a tunnel insulation layer on the charge trap layer, wherein the tunnel insulation layer is in contact with the carbon region of the charge trap layer; and
   forming a channel layer on the tunnel insulation layer.

2. The method according to claim 1, wherein forming the charge trap layer comprises:
   forming the carbon region at predetermined temperatures.

3. The method according to claim 2, wherein forming the carbon region comprises:
   transforming a portion of the charge trap layer into the carbon region in an environment that includes carbon substances and nitrogen substances.

4. The method according to claim 1, wherein forming the tunnel insulation layer on the charge trap layer comprises:
   forming an interface between the carbon region and the tunnel insulation layer.

5. The method according to claim 1, wherein:
   the carbon region is proximate to the tunnel insulation layer with respect to the blocking layer.

6. The method according to claim 1, wherein:
   the carbon region includes silicon nitride and the certain amount of carbon elements.

7. The method according to claim 1, wherein:
the blocking layer includes silicon oxide.
8. The method according to claim 1, wherein:
the tunnel insulation layer includes silicon oxide.
9. The method according to claim 1, wherein:
the layer stack includes a conductor layer and a dielectric layer, alternately stacked.

\* \* \* \* \*